United States Patent [19]

Guillen et al.

[11] 3,710,377

[45] Jan. 9, 1973

[54] HIGH SPEED ANALOG-TO-DIGITAL CONVERTER

[75] Inventors: Francisco J. Guillen, Ellicott City, Md.; Matthew J. Campanella, Hammonton, N.J.

[73] Assignee: Westinghouse Electric Corporation, Pittsburgh, Pa.

[22] Filed: Jan. 11, 1971

[21] Appl. No.: 105,549

[52] U.S. Cl.........................340/347 AD, 340/347 SH

[51] Int. Cl..............................................H03k 13/02

[58] Field of Search..................340/347 AD, 347 SH

[56] References Cited

UNITED STATES PATENTS

| | | | |
|---|---|---|---|
| 3,588,876 | 6/1971 | Chatelon | 340/347 AD |
| 3,585,631 | 6/1971 | McCown | 340/347 AD |
| 3,384,889 | 5/1968 | Lucas | 340/347 AD |
| 3,530,459 | 9/1970 | Chatelon | 340/347 AD |
| 3,383,655 | 5/1968 | McRae | 340/347 AD |
| 3,493,958 | 2/1970 | Gorbatenko | 340/347 AD |
| 3,581,304 | 5/1971 | Paradise | 340/347 AD |

*Primary Examiner*—Thomas A. Robinson
*Assistant Examiner*—Jeremiah Glassman
*Attorney*—F. H. Henson, E. P. Klipfel and S. Weinberg

[57] ABSTRACT

An analog signal is directed to a plurality of comparators. Each of the comparators has a different threshold level of conduction. Each threshold level is determined by a different reference voltage being applied to each of the comparators. The outputs of the comparators are sampled at a predetermined rate by a plurality of flip-flops whose outputs are held constant while they are decoded into usable form and directed to a shift register. The decoded outputs are also reconverted into an analog voltage which is compared with the original analog signal by a difference amplifier. The amplified difference signal is directed to a second bank of comparators which provide another approximation. The outputs of the second bank of comparators are sampled and decoded in the same manner as the original analog signal. This latter decoded signal is also sent to the output shift register. It is also sent through another sub-ranging network.

7 Claims, 3 Drawing Figures

HIGH SPEED ANALOG-TO-DIGITAL CONVERTER

CROSS REFERENCE TO RELATED APPLICATION

This application is related to application Ser. No. 49,131 now U.S. Pat. No. 3,602,799, entitled "Ultra-Stable High-Speed Current Sources" by F. J. Guillen and is assigned to the same assignee as the present application.

BACKGROUND OF THE INVENTION

1. Field of the Invention

In general, the present invention relates to an analog-to-digital converter. More specifically, it relates to an analog-to-digital converter which first quantizes the analog signal and then samples it and holds the sample constant while it is converted into digital information.

2. Description of the Prior Art

Prior to this invention, many analog-to-digital converters have required the use of analog sample and hold circuits — that is, sample and hold circuits on the analog side of the converter. The constraint of placing the sample and hold circuits on the analog side presented severe limitations in attainable aperture times, acquisition time, and speed of operation. Aperture time is defined as the uncertainty of time where the sample of the analog signal occurs.

FIG. 1 shows a functional block diagram of such a typical prior art device. The analog signal 2 is amplified by an amplifier 4. The amplified analog signal is sampled by capacitor 8 each time switch 6 is closed and opened. The voltage sample across capacitor 8 is then directed to analog-to-digital converter 10 where it is converted into digital information.

One problem with the prior art device shown in FIG. 1 is the inertia of the switch 6. In order to attain a very high sampling rate, the switch 6 must be opened and closed very rapidly. The speed at which the switch can be opened and closed is limited by its inertia. Even if an electronic switch is used, it will still be relatively slow because it must allow and compensate for transients.

A second problem has resulted from the tendency of capacitor 8 to discharge its voltage because it must hold the voltage for a comparatively long period of time while the conversion takes place. Third, if it were desired to prevent the capacitor from discharging, the analog-to-digital converter 10 would have to be designed so that it would have a very high input impedance. It is very expensive to design and build such a high input impedance converter. Fourth, it takes a relatively long time for the capacitor to reach the value of the input voltage. This is called acquisition time.

The prior art then developed the digital sample and hold. A circuit utilizing a digital sample and hold for analog-to-digital conversion is illustrated by the U.S. Pat. No. to J. F. Flood 3,210,756. However, the Flood circuit cannot attain the speed of operation of the present invention because Flood requires that the analog signal first be converted into a binary code. The binary code must then be converted to a gray code and passed through a filter before reaching the sample and hold elements. The use of the gray code greatly impedes the speed of conversion of the device shown in the Flood patent.

BRIEF SUMMARY OF THE INVENTION

The analog signal is directed to a circuit, which includes a plurality of circuits, for quantizing the analog signal. The quantizing circuit includes a plurality of threshold circuits in the form of comparators. Each of the comparators requires a different threshold voltage input before it will conduct. Once the threshold voltage of the first comparator is set, the threshold voltages of succeeding comparators are set to require progressively higher threshold voltages. Therefore, for example, if the fourth comparator becomes conductive, it necessarily follows that the first three comparators are also conductive. In response to a sampling signal, the signals on the outputs of the comparators are sampled. The samples are held constant until the next sample pulse. The outputs of the sampling circuits are connected to a decoding circuit which decodes the samples into digital information.

The digital information is then directed to two different places. It is directed to a storage device. It is also directed to a difference circuit which provides a signal which is related to the difference between the sampled signal and the original analog input signal. The difference signal is then directed to a second quantizing circuit which quantizes and samples the difference signal and processes it in the same manner as the original analog signal was processed. After the difference signal has been sampled and decoded, the output of the second decoding circuit is directed to the storage device. The process is continued until the storage device is holding, to the accuracy desired, a digital approximation of the analog input signal.

BRIEF DESCRIPTION OF THE DRAWINGS

For a better understanding of the invention, reference may be had to the preferred embodiment, exemplary of the invention, shown in the accompanying drawings in which.

DETAILED DESCRIPTION OF THE INVENTION

Figure 2:
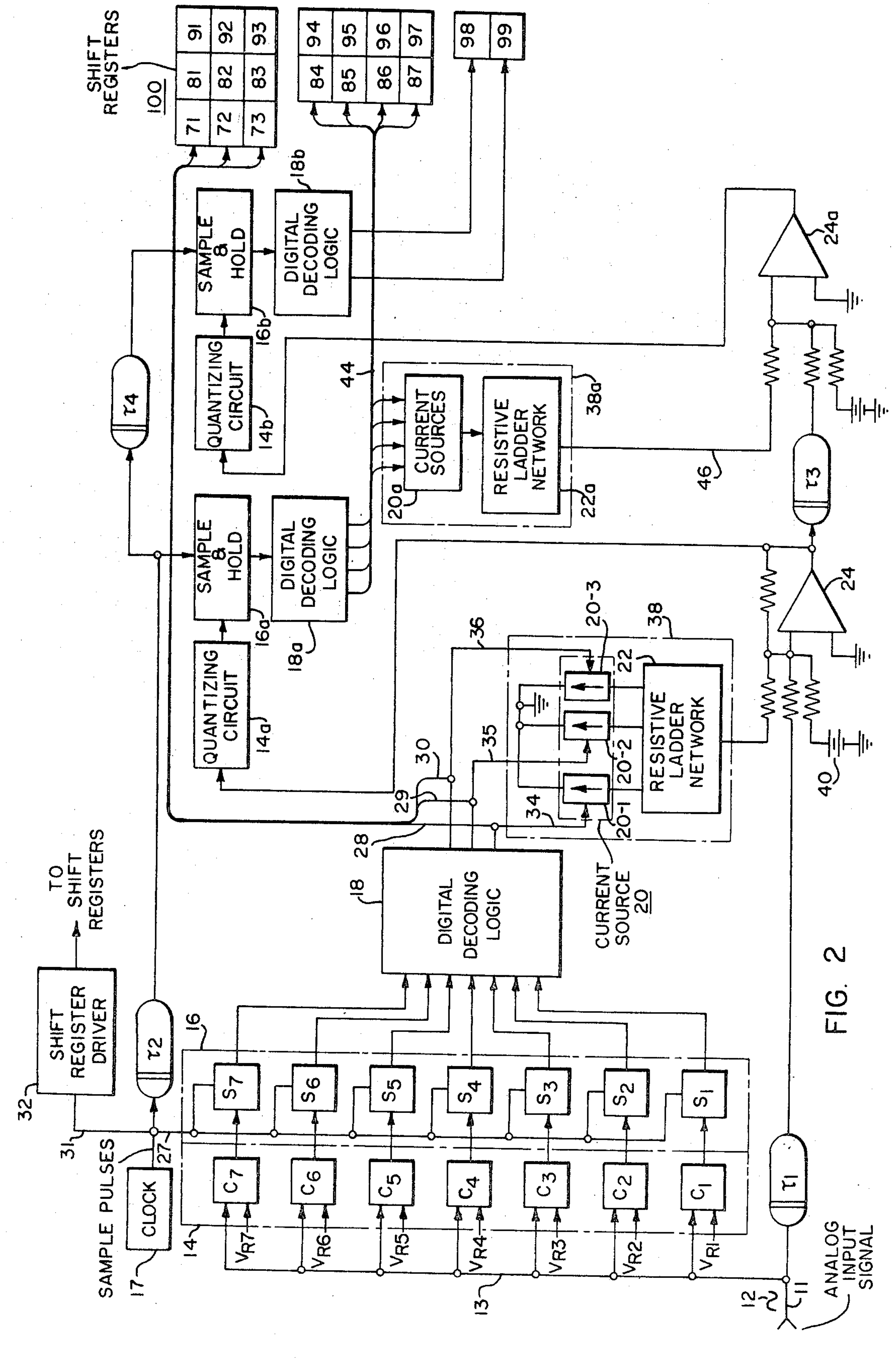
FIG. 2 is a functional block diagram of a preferred embodiment of the invention.

Referring to FIG. 2, a rapidly changing analog signal 12 is connected, over lines 11 and 13 to a quantizing circuit 14. Quantizing circuit 14 includes a plurality of comparators $C_1$ to $C_7$. Line 13 simultaneously connects the analog signal 12 to all of the comparators. In the preferred embodiment of FIG. 2, seven comparators are used. Of course, it will be apparent to those skilled in the art, that more or fewer comparators could be used depending upon the accuracy desired. The comparators quantize the analog signal which could be, for example, video signals returned from a radar system or any rapidly changing signal. That is, the comparators divide the analog signal into a plurality of voltage ranges.

Figure 1:
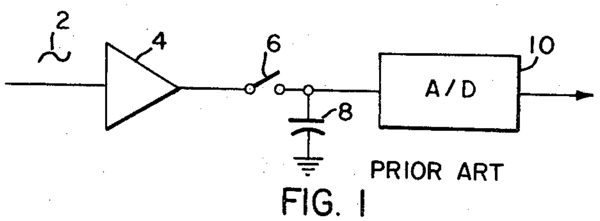
FIG. 1 shows a functional block diagram of a prior art converter.
Figure 3:
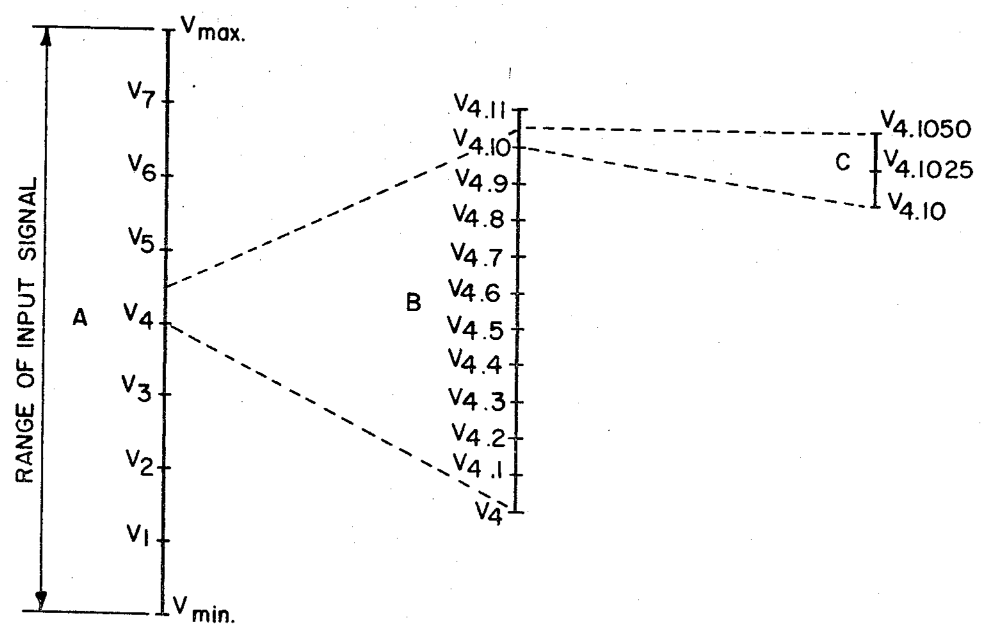
FIG. 3 shows three bar graphs A, B, and C which graphically depict how the analog signal is divided at each stage of the invention.

Referring to FIG. 3, bar graph A shows the range of the analog input signal in terms of a voltage varying from a minimum voltage ($V_{min}$) to a maximum voltage ($V_{max}$). The voltage range between $V_{min}$ and $V_{max}$ is divided or quantized into eight ranges which are represented by the discrete voltage levels $V_1$ to $V_7$. The discrete voltage levels $V_1$ to $V_7$ are provided by the seven comparators $C_1$ to $C_7$ of the quantizing circuit 14 shown in FIG. 2.

Each of the comparators $C_1$ to $C_7$ is a very high gain digital-type device. Each of the comparators could be, for example, a $\mu$ A710 semiconductor device by Fairchild Corporation having a gain of 1700. Each comparator compares a different reference voltage with the changing analog input signal. Looking at comparator $C_1$ as an example, as soon as the value of the analog input signal 12 exceeds the reference voltage $V_{R1}$ by even a very small amount, comparator $C_1$ will provide an output signal. The output signal of $C_1$ will not change even though the magnitude of the analog input signal increases even further. Moreover, as soon as the magnitude of the analog input signal decreases below the value of the reference voltage $V_{R1}$, comparator $C_1$ will not provide any output signal. Thus, the comparators which are used in the quantizing circuit 14 are unlike a differential amplifier which provides a continually changing output. To the contrary, each of the comparators $C_1$ to $C_7$ provides only two levels of output. One of these levels occurs whenever the analog input signal exceeds, by a small amount, the magnitude of the particular reference voltage on the comparator. The other level is the ZERO level. Therefore, comparator $C_2$ will not produce an output until and unless the magnitude of the analog input signal exceeds reference voltage $V_{R2}$. In like manner, comparators $C_3$, $C_4$, $C_5$, $C_6$ and $C_7$ will not provide an output unless their respective reference voltages have been exceeded by the analog input signal. Furthermore, if, for example, comparator $C_4$ is providing an output, it necessarily follows that comparators $C_1$, $C_2$ and $C_3$ are likewise providing an output. Although the magnitude of the output of each of the comparators are equal in the preferred embodiment, they could provide outputs of different magnitudes and still be useful in an alternative embodiment.

Each of the reference voltages $V_{R1}$ to $V_{R7}$ are provided by precise resistor dividers. Each of the resistor dividers are designed to provide a different voltage output. The output of the second resistor divider is greater than the output voltage of the first resistor divider, and the third is greater than the second and so on up until the seventh resistor divider so that the overall voltage range is divided into the appropriate number of subranges. Therefore, even though the comparators $C_1$ to $C_7$ may be substantially identical, each one will provide an output signal only when its respective reference voltage has been exceeded.

Because the comparators can be only in one of two states, fully "off" or fully "on", its "off" state can be defined as a logical ZERO and its "on" state as a logical ONE. The outputs of the comparators $C_1$ to $C_7$ of the quantizing circuit 14 are connected to an equal number of sample and hold circuits $S_1$ to $S_7$ of the same and hold 16. Each of the sample and hold circuits is a flip-flop (or an equivalent device) the output of which can either be a logical ONE or a logical ZERO. The flip-flops can be, for example, an emitter coupled flip-flop manufactured by Motorola Corporation, (known as MECL flip-flop). They are monolithic, non-saturated logic, integrated circuits and are very fast.

Whenever the sample and hold circuits receive a sample pulse from clock 17 along line 27, the output of each sample and hold circuit is determined by the input received from its respective comparator. If the output of the appropriate comparator is a logical ONE (i.e., if it is providing an output signal) then the appropriate sample and hold circuit will also provide a logical ONE output. However, if the appropriate comparator is providing a logical ZERO output (that is, it is not providing any output) then the appropriate sample and hold circuit will also provide a logical ZERO output.

More specifically, consider sample and hold circuit $S_2$. If the analog input signal exceeds voltage reference $V_{R2}$, then comparator $C_2$ will be providing an output — i.e., its output will be a logical ONE. Therefore, when sample and hold circuit $S_2$ receives a sample pulse along line 27, its output will also be a logical ONE. However, if, for example, the magnitude of the analog input signal is somewhere between voltage $V_1$ and voltage $V_2$, then comparator $C_2$ will not provide an output — i.e., its output will be a logical ZERO. Accordingly, when a sample pulse is directed to sample and hold circuit $S_2$ along line 27, its output will likewise be a logical ZERO.

Flip-flops are used for the sample and hold circuits $S_1$ to $S_7$ because they are, in a sense, memory devices. That is, once the output of a flip-flop is set by the combination of a sample pulse and an input signal, its output will not change until the next sample pulse - that is, it will hold that output constant until the next sample pulse occurs. To be more specific, if upon receiving a sample pulse along line 27, sample and hold circuit $S_2$ provides a logical ONE output, that output cannot and will not change until sample and hold circuit $S_2$ receives the next sample pulse.

The memory aspect of the sample and hold circuits is an important aspect of the invention because the analog input signal is always changing. As a result, the inputs and outputs of each of the comparators are likewise changing. However, once the inputs to the sample and hold circuits are sampled, the sample and hold circuits provide outputs which are held constant long enough for them to be used. The outputs of the sample and hold circuits are not subjected to the fast changes of the analog input signal and, as a result, the stored states at the instant of the sample pulse are held.

In operation, the analog input signal 12 is directed from line 11 to the bank of comparators $C_1$ to $C_7$ along line 13. The comparators $C_1$ to $C_7$ quantize the analog signal. That is, in the preferred embodiment, the comparators indicate in which of eight ranges the signal lies at any instant of time by comparing the analog input signal with a plurality of reference voltages $V_{R1}$ to $V_{R7}$. As the value of the analog input signal increases, more of the comparators will be conductive — i.e., more of them will provide a logical ONE output. Likewise, as the value of the analog input signal decreases, a smaller number of the comparators will be providing a logical ONE output.

Each of the comparators is connected to a respective sample and hold circuit. Each time the clock 17 sends out a sample pulse to the sample and hold circuits, the sample and hold circuits determine which of the comparators are conducting. That is, the sample and hold circuits determine the maximum range in which the analog input signal resides at the time of the sample pulse. For example, if the clock is operating at 10 MHz sampling rate, then each pulse will occur every 100 nanoseconds (ns). There is only one requirement imposed on the sampling rate: it must be at least twice the frequency of the highest frequency component of the analog signal. This requirement is dictated by sampling theory, as will be understood by those skilled in the art.

The outputs of all of the sample and hold circuits are connected to a set of gates which make up the digital decoding logic circuit 18. Digital decoding logic circuit 18 analyzes the outputs from all of the sample and hold circuits and converts these outputs into usable information. In the preferred embodiment, the usable information is in the form of three significant bits. Of course, a larger number of bits or a smaller number of bits could be used depending upon the application to which the information is to be used.

The output bits from the digital decoding logic 18 is fed into two directions. First, they are fed by lines 28, 29 and 30 to a storage device 100. In the preferred embodiment, the storage device 100 is the leading stages 71, 72, 73 of three three-bit shift registers. As is well known to those familiar with shift registers, a clocking pulse is necessary in order to enter information into shift registers. The clocking pulse is provided ultimately by clock 17.

Very efficient use is made of the clock pulses from the clock 17. Every time the clock 17 provides a sample pulse along line 27 to the sample and hold circuits, it is simultaneously directed along line 31 to the shift register driver 32. The shift register driver 32 provides sufficient drive for the clock pulse appearing on line 31 to drive the shift registers. It also delays the clock pulse a sufficient length of time so that it arrives at the shift registers at almost the same point in time, that is, slightly before, the three-bit output on lines 28, 29 and 30 arrives at the shift registers. In the preferred embodiment, the shift register driver is designed to delay the clock pulse approximately 95ns. Therefore, when the digital decoding logic 18 has converted the outputs of the sample and hold circuits into three-bit information, and then directs this information along lines 28, 29 and 30 to the leading stages of the shift register, the leading stages of the shift register almost simultaneously receives the delayed clock pulse so that the digital information can be entered into flip-flops 71, 72 and 73 which comprise the leading stages of the shift register 100.

The 3-bit data is also directed along lines 34, 35 and 36 to a digital-to-analog converter 38. The digital-to-analog converter 38 is comprised of a current source 20 and a resistive ladder network 22. Current source 20 is comprised of three constant current sources 20–1, 20–2 and 20–3. The construction and operation of the constant current sources are described in more detail in applicant's previously mentioned application Ser. No. 49,131. Various combinations of the current sources 20–1, 20–2 and 20–3 will become conductive depending upon the output from the digital decoding logic circuit 18. For example, depending on how many sample and hold circuits are providing a logical ONE output, line 34 may be the only line from circuit 18 on which a signal is present. In such a case, only constant current source 20–1 will be conductive. The result of the combination of the current source 20 with the resistive ladder network 22 is to reconvert the three-bit data into a voltage at the output of resistive ladder network 22. Assuming, for example, that at the moment of sampling, the value of the analog input signal was between $V_2$ and $V_3$, then the voltage output of the resistive ladder network will be equal to the voltage from the minimum voltage to $V_2$.

The voltage output from resistive ladder network 22 provides one input to a wideband operational subranging amplifier 24. The second input to the subranging amplifier 24 is the incoming analog input signal. In order for the output voltage from resistive ladder network 22 and the analog input signal to arrive the subranging amplifier 24 at almost the same time, the analog input signal is delayed by a delay line $\tau_1$. The delay line $\tau_1$ causes the analog input signal to arrive at the other input of the subranging amplifier after the output voltage of the resistive ladder network 22 has been established. In a practical embodiment, delay line $\tau_1$ will delay the analog input signal approximately 95 ns.

The subranging amplifier 24 subtracts the decoded output voltage level of the resistor ladder network 22 from the delayed analog input signal and provides a signal related to the difference between them. The amplifier 24 also amplifies the difference signal in order to increase the effective quantum size so that the precision requirements of subsequent circuit stages may be relaxed. In a preferred embodiment, the subranging amplifier 24 would multiply the effective quantum size by 2½ times. However, other multiplicative factors could be used if desired. The increased effective quantum size is illustrated by bar graph B of FIG. 3. Since the voltage output from the resistive ladder network 22, which is subtracted from the input signal, is determined by the range in which the signal lies, the resulting output of the subranging operational amplifier 24 is always within prescribed limits.

For example, assume that quantizing circuit 14 divides the analog input signal into ranges of 10 volts each; and further assume that the voltage at the time of sample, lies in the range between $V_2$ and $V_3$. The output voltage from the resistive ladder network 22, therefore, would be equal to voltage $V_2$. The subranging amplifier 24 would then subtract voltage $V_2$ from the actual analog input signal which had been delayed. Therefore, the difference voltage which resulted could be no more than 10 volts.

If desired, a third input can be connected to the subranging amplifier 24 to cause the amplifier output to swing symmetrically about zero volts in order to prevent saturation of the amplifier. The value of the DC source 40 supplying the voltage will be determined by the saturation level of the amplifier 24 which is used. Depending upon the saturation level, such a DC source 40 may not even be necessary.

The output of the subranging amplifier 24 is directed along line 42 to serve as the input for a second bank of comparators which make up a second quantizing circuit **14*a* in order to further quantize the signal. In a preferred embodiment, 15 comparators are used in the quantizing circuit 14*a***. The effect of using these comparators can be seen in bar graph B of FIG. 3. FIG. 3 shows how, for example, a voltage between $V_4$ and $V_5$ shown in bar graph A, is expanded so that in bar graph B it can be determined that the voltage is really between $V_{4.10}$ and $V_{4.11}$.

After the second quantizing circuit 14a has quantized the difference signal in the same manner as the first quantizing circuit 14 quantized the original analog input signal, the output of the second quantizing circuit 14a is directed to a second sample and hold circuit 16a. The sample pulse for the second sample and hold circuit 16a is delayed by an amount, $\tau_2$. Thus, another use has been made of the original sample pulse which had been used to enable the first sample and hold circuit 16. In a preferred embodiment, the amount of the delay $\tau_2$ will be about 95ns. The output of the sample and hold circuit 16a is then decoded by the digital decoding logic circuit 18a.

When the data obtained from the second digital decoding logic 18a are available, it is directed along line 44 for storage in the first stages 84, 85, 86 and 87 of four two-bit shift registers. At the same time, the data which had previously been stored in the first stages 71, 72, 73 of the three-bit shift registers is transferred to the second stages 81, 82, 83. Thus, data corresponding to the same sampled point of the analog input signal 12 are aligned for subsequent parallel readout. The clock pulse which both enables the data along line 44 to be entered into the leading stages of the four-bit register and which, simultaneously, transfers the data from the first three stages of the three bit register to the second stages of the three bit register is provided by the shift register driver 32. In the case of a 10 MHz sample rate, the clock pulses are received every 100 ns.

Thus, it can be seen that clock 17 provides all of the clock pulses and sample pulses for the entire circuit. Each time a sample pulse causes the sample and hold circuit 16 to sample the output of quantizing circuit 14, previously delayed sample pulses are performing the following: (1) sampling the difference signal at sample and hold circuit 16a; (2) entering three bit digital information into leading stages 71, 72 and 73, (3) transferring data from stage 71 to 81, from 72 to 82, and from 73 to 83; (4) entering information into stages 84, 85, 86 and 87.

In the preferred embodiment, the process is repeated by a third stage to further resolve the signal to nine bit accuracy. This is illustrated in bar graph C of FIG. 3 which shows a further subdivision of the voltage between $V_{4.10}$ and the actual voltage.

In practice, the output from the digital decoding logic circuit 18a is directed to a second digital-to-analog converter 38a where it is reconverted into an analog signal. This new analog signal is directed along line 46 and forms one of the inputs through a second subranging amplifier 24a. The subranging amplifier 24a increases the effective quantum size. The second input to the subranging amplifier 24a is the difference signal output from subranging amplifier 24 which had been delayed by delay line $\tau_3$. The amount of delay provided by $\tau_3$ is 95ns in the preferred embodiment. The output of subranging amplifier 24a is then directed to a third quantizing circuit 14b the output of which is sampled by a third sample and hold circuit 16b by sample pulses which, in the preferred embodiment, have been delayed 95ns by the delay line $\tau_4$. The output of sample and hold circuit 16b is then decoded by digital decoding logic 18b which provides two bits of data for storage in a single stage of flip-flops 98, 99 of a shift register 100. When the data are entered into stages 98 and 99, all the information in the other stages are advanced to the next subsequent stage so that now the full nine bits 91 to 99 can be read out simultaneously.

We claim as our invention:

1. A circuit for converting an analog signal into digital information comprising, in combination;
   - a plurality of threshold circuits;
   - means for simultaneously connecting said analog signal to said plurality of threshold circuits for quantizing said analog signal;
   - a first threshold circuit of said plurality of threshold circuits requiring a first threshold voltage;
   - succeeding threshold circuits requiring progressively higher threshold voltages;
   - respective ones of said threshold circuits being operable to provide an output signal in response to said analog signal exceeding said threshold voltages of said respective ones;
   - sampling means for sampling said output signals and for providing a plurality of logic signals, the number of logic signals being directly related to the number of output signals;
   - said sampling means being operable to hold said plurality of logic signals constant while said plurality of logic signals are converted into digital information.

2. The circuit of claim 1 wherein
   - said plurality of threshold circuits includes a plurality of comparators;
   - said circuit further including
   - a plurality of reference voltage means for providing a plurality of progressively increasing reference voltages, respective ones of said reference voltage means being connected to respective ones of said comparators.

3. The circuit of claim 1 wherein said means for sampling and holding said output signals includes a plurality of flip-flops, respective ones of said flip-flops being operable to receive respective ones of said output signals.

4. The circuit of claim 1 including
   - decoding means for converting said plurality of logic signals into digital information;
   - first means for directing said digital information in a first direction to a storage means;
   - second means for directing said digital information in a second direction for conversion into a new analog signal;
   - a second plurality of threshold circuits;
   - comparison means for comparing the magnitude of said new analog signal with the magnitude of said analog signal;
   - the output of said comparison means being directed to said second plurality of threshold circuits for converting the output of said comparison means into further digital information; and
   - third means for directing said further digital information to said storage means.

5. The circuit of claim 4 including, means for directing said analog signal to said comparison means, said last mentioned directing means including a time delay means for delaying the transmittal of analog signal to said comparison means.

6. The circuit of claim 1 wherein said analog signal includes a changing analog signal and wherein said circuit includes means for energizing said sampling means at a predetermined rate, the sampling frequency being at least twice the frequency of said analog signal.

7. The circuit of claim 6 wherein said sampling means is energized by sample pulses, said sampling means being operable to hold constant said plurality of logic signals between successive sample pulses.

* * * * *